United States Patent [19]

Pierce et al.

[11] 4,267,012
[45] May 12, 1981

[54] PROCESS FOR PATTERNING METAL CONNECTIONS ON A SEMICONDUCTOR STRUCTURE BY USING A TUNGSTEN-TITANIUM ETCH RESISTANT LAYER

[75] Inventors: John M. Pierce, Palo Alto; William I. Lehrer, Los Altos; Kenneth J. Radigan, Mountain View, all of Calif.

[73] Assignee: Fairchild Camera & Instrument Corp., Mountain View, Calif.

[21] Appl. No.: 34,781

[22] Filed: Apr. 30, 1979

[51] Int. Cl.[3] .................. H01L 21/283; H01L 21/308
[52] U.S. Cl. ...................................... 156/643; 29/591; 156/656; 156/664; 156/665
[58] Field of Search ............... 156/656, 657, 662, 643, 156/664, 665; 29/591; 357/71; 427/93, 95, 255

[56] References Cited

U.S. PATENT DOCUMENTS

| | | | |
|---|---|---|---|
| 3,480,412 | 11/1969 | Duffek et al. | 29/591 |
| 3,615,956 | 10/1971 | Irving et al. | 156/646 |
| 3,881,884 | 5/1975 | Cook et al. | 29/591 |
| 3,881,971 | 5/1975 | Greer et al. | 156/657 |
| 3,900,944 | 8/1975 | Fuller et al. | 156/656 |
| 4,021,270 | 5/1977 | Hunt et al. | 357/71 |
| 4,057,460 | 11/1977 | Saxena et al. | 156/643 |
| 4,073,669 | 2/1978 | Heinecke et al. | 156/643 |
| 4,094,732 | 6/1978 | Reinberg | 156/643 |
| 4,141,022 | 2/1979 | Sigg et al. | 357/71 |
| 4,172,004 | 10/1979 | Alcorn et al. | 156/643 |

*Primary Examiner*—Jerome W. Massie
*Attorney, Agent, or Firm*—Paul J. Winters; Robert C. Colwell; Michael J. Pollock

[57] ABSTRACT

A process for patterning regions on a semiconductor structure comprises the steps of forming a first layer of an alloy of tungsten and titanium on the semiconductor structure, forming a conductive layer of aluminum or chemically similar material on the surface of the tungsten-titanium alloy, removing the undesired portions of the conductive layer by etching with a plasma and removing the thereby exposed portions of the tungsten-titanium alloy layer by chemical etching.

19 Claims, 7 Drawing Figures

PROCESS FOR PATTERNING METAL CONNECTIONS ON A SEMICONDUCTOR STRUCTURE BY USING A TUNGSTEN-TITANIUM ETCH RESISTANT LAYER

BACKGROUND OF THE INVENTION

1. Field of the Invention

This invention relates to the patterning of regions of material over chosen portions of semiconductor structures. In particular, this invention relates to plasma etching techniques for fabricating conductive layers of aluminum or chemically similar materials over selected portions of semiconductor structures.

2. Prior Art

Continuing improvements in semiconductor fabrication technology have caused the dimensions of some integrated circuit structures to be limited by the dimensions of aluminum or other metal lines formed on the surface of the structure to interconnect various portions of the underlying structure. Because the chemical reactions involved are not directional isotropic wet chemical etchants are not suitable for etching through thick metal lines while simultaneously accurately retaining lateral dimensions. One technique which has been developed to allow more accurate control of dimensions is etching of semiconductor structures with plasma. Various processes for plasma etching are now known and have been the subject for several patents. See, e.g., U.S. Pat. No. 3,615,956 entitled "Gas Plasma Vapor Etching Process"; U.S. Pat. No. 3,994,793 entitled "Reactive Ion Etching of Aluminum"; and U.S. Pat. No. 4,057,460 entitled "Plasma Etching Process."

Plasma etching processes have been developed which use chlorine based plasmas to remove aluminum with little or no undercutting of overlying protective materials, for example, photoresist. Unfortunately, after removing the aluminum such plasma processes also will etch any silicon beneath the aluminum. Because in commercial processing of large quantities of integrated circuits some or all of the integrated circuits will remain in the plasma etching reactor for some time after the aluminum has been removed from one of the circuits, and because the rate of removal of material by plasma etching is not necessarily uniform across even the surface of a single circuit being etched, a significant amount of etching of materials underlying the aluminum has been observed. For example, in some areas of the integrated circuit the aluminum will be completely removed from undesired regions in a very short time, while in other areas a much longer time will be required to remove the aluminum. Consequently in those areas where the aluminum is removed relatively quickly the plasma etching will remove underlying materials. This problem usually is most severe in areas of integrated circuits where metal connections make direct contact to underlying silicon, for example, the emitters of bipolar transistors or the sources or drains of MOS transistors. In these areas of the integrated circuit there are frequently PN junctions close to the surface of the silicon, and even shallow plasma etching of the silicon can expose or destroy the PN junction and ruin the function of the device.

Additionally, because silicon is soluble in aluminum, aluminum formed over silicon may dissolve portions of the silicon and seep into the underlying structure, creating spikes which degrade or destroy the operation of the integrated circuit. This problem has been partially overcome by the use of aluminum-silicon metal alloys which are saturated or nearly saturated solutions, in which solutions the underlying pure silicon will be much less soluble. Unfortunately, when the aluminum-silicon is chemically removed from the surface of the structure, some of the silicon from the aluminum-silicon mixture will remain on the surface of the structure. This residual silicon increases the roughness of the surface of the semiconductor structure, and makes difficult the reliable subsequent formation of metal conducting lines or other regions on the surface.

Therefore, one object of this invention is to provide a means of overcoming the difficulty of utilizing chlorine based plasma etching for patterning aluminum or chemically similar material layers on semiconductor structures. A further object of this invention is to eliminate the need for adding silicon to the aluminum or other material chosen to form the metallization layers.

SUMMARY OF THE INVENTION

The present invention relates to a process for patterning layers of material formed on a semiconductor structure. In particular, for fabricating conductive metal connections on a semiconductor structure, the process includes the steps of forming a first layer of an alloy of plasma etch resistant material on the semiconductor structure, forming a conductive layer on the surface of the first layer, removing the undesired portions of the conductive layer by plasma etching, and removing the thereby exposed portions of the first layer by chemical etching. Typically the step of removing the undesired portions of the conductive layer will be accomplished by first forming a protective coating over the desired portions of the conductive layer which coating is resistant to the process used to remove the undesired portions of the conductive layer. In addition the invention may be used to form protective coatings over regions of semiconductor structures which are to be protected from plasma during etching.

The invention allows more accurate dimensional control of metal connections or other layers of material on integrated circuit structures, provides a layer of material resistant to the plasma etching gas, and protects what will become exposed regions of the integrated circuit structure until the plasma etching process is complete. The etch resistant layer may be fabricated sufficiently thin so that no substantial undercutting of the layer occurs when it is subsequently chemically etched. Alternatively, if sloped metal edges are desired, the layer may be intentionally undercut. Further, when used in conjunction with an aluminum layer the etch resistant layer acts as a diffusion barrier to aluminum migration and eliminates the need for adding silicon to the aluminum when fabricating metallization layers. This provides more reliable protection from junction "spiking" and leaves less residue on the semiconductor structure than conventional aluminum-silicon processing. Further, the etch-resistant layer provides a redundant electrical connection over steps or other non-uniformities in the underlying surface topography, and improves the resistance of the structure to electromigration.

DETAILED DESCRIPTION

Figure 1:
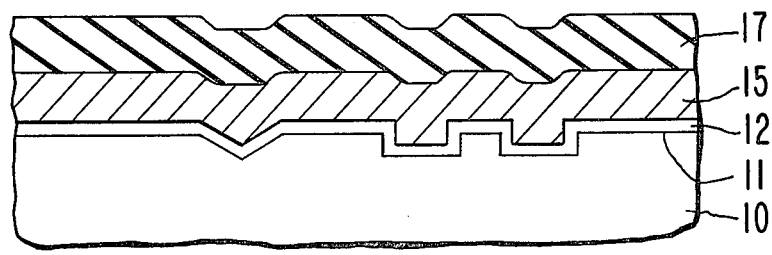
FIG. 1 is a cross-sectional view of a semiconductor structure, showing a tungsten-titanium plasma etch resistant layer, an aluminum layer, and a photoresist layer.

FIG. 1 is a cross-sectional view of a semiconductor structure 10. In the preferred embodiment electrical connections are to be formed to contact desired portions of the surface 11 of structure 10. Semiconductor structure 10 may be any type of semiconductor structure, for example an integrated circuit. As shown in FIG. 1, on the surface 11 of semiconductor structure 10 a layer of plasma etch-resistant material 12 is formed. In the preferred embodiment, this layer comprises tungsten-titanium alloy between 500 and 2000 Angstroms thick. The tungsten-titanium alloy may contain between 50% and 100% tungsten by weight, and in the preferred embodiment contains 90% by weight. Layers of such alloys may be formed by any of several well known techniques, for example by sputtering. It should be understood that structure 10 may include arbitrary regions of conductive, non-conductive, or semiconductive material previously formed, for example, aluminum, silicon dioxide or silicon. In one embodiment a thin layer of titanium approximately 200 Angstroms thick is formed across the surface of structure 10 immediately prior to the formation of layer 12. This thin layer of titanium provides a more reliable electrical connection between the tungsten-titanium layer 12 and structure 10. Any underlying layers, however, will not affect the formation of the tungsten-titanium layer 12, that is, layer 12 may be formed directly over the surface of underlying materials. When the underlying material is titanium the tungsten-titanium layer 12, when formed, will dissolve some of the underlying layer and create a graded alloy structure extending to the base of the titanium layer.

Applicants have discovered that tungsten-titanium alloys formed approximately 500 to 2000 Angstroms thick will act as an effective etch stop during plasma etching of overlying material, such as aluminum, in a chlorine-base plasma. The layer of tungsten-titanium has been found to resist the action of the chlorine based plasma and to therefore protect underlying sensitive areas of the integrated circuit structure 10 from attack by the plasma.

As shown in FIG. 1 a layer 15 of aluminum or chemically similar material is formed across the surface of layer 12. "Chemically similar material" is used herein to designate any material which may be plasma etched in a chlorine based etch gas. Such chemically similar materials include, but are not limited to silicon, chromium, and alloys of these materials with aluminum. Such layers of aluminum 15 or other material, typically conductive, may be deposited to the thickness required by the design of the underlying integrated circuit 10 by any suitable method, for example, sputtering. In one embodiment aluminum layer 15 is 10,000 Angstroms thick and formed by sputtering at a temperture of 370° C. On the surface of aluminum 15 is formed a masking layer 17. Masking layer 17 typically will be photoresist.

Figure 2:
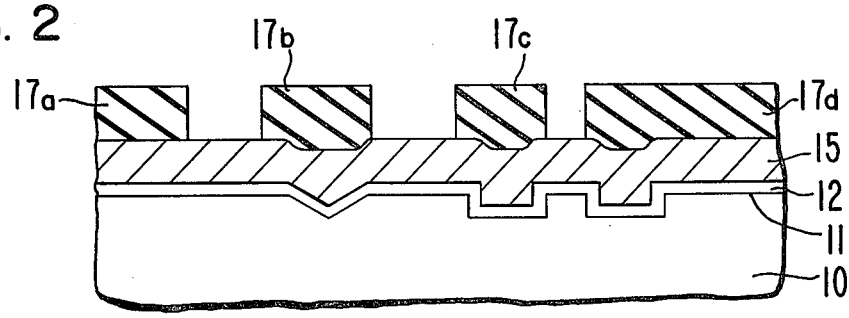
FIG. 2 is a further cross-sectional view showing the photoresist layer after it has been suitably patterned.

Photoresist layer 17 may be exposed and developed to remove undesired portions thereof by using conventional semiconductor fabrication techniques. As shown in FIG. 2 openings through the photoresist layer 17 have been made to aluminum layer 15, while regions of photoresist 17a, 17b, 17c and 17d, remain on the surface of aluminum 15 to thereby prevent etching of the underlying aluminum 15.

Figure 3:
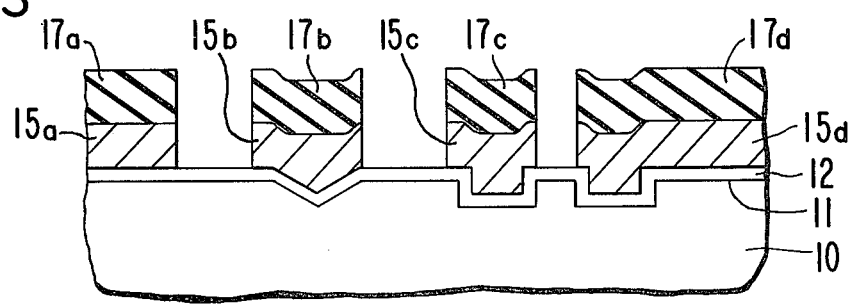
FIG. 3 is a further cross-sectional view after portions of the aluminum layer have been plasma etched.

Next, as shown in FIG. 3, using commercially available plasma etching equipment, for example, the IPC 5000 plasma etch reactor, now made by Dionex Co., aluminum layer 15 may be plasma etched. Typically, aluminum layer 15 will be etched using well known suitable chlorine containing etch gases, for example, carbon tetrachloride. As mentioned above, the chlorine plasma will not attack the tungsten-titanium layer 12, which thereby functions as an etch stop for the procedure. Because aluminum layer 15 is etched using plasma there will be little or no undercutting of aluminum layer 15 beneath the edges of photoresist layer 17. Consequently the regions of aluminum 15a, 15b, 15c and 15d, will have substantially the same lateral dimensions as do the overlying regions of photoresist 17a, 17b, 17c and 17d, respectively. Thus accurate dimensional control is facilitated.

Figure 4:
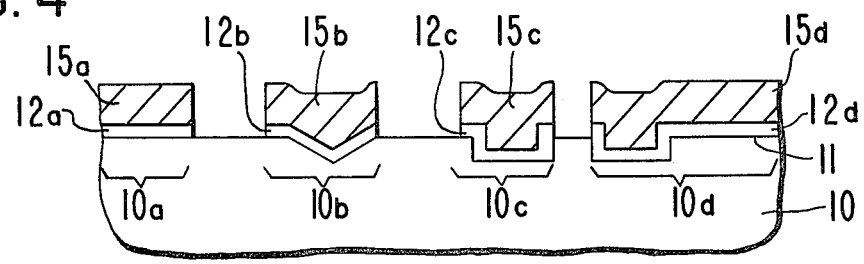
FIG. 4 is a further cross-sectional view showing the appearance of the semiconductor structure after chemically removing the undesired portions of the tungsten-titanium layer.

As shown in FIG. 4 tungsten-titanium layer 12 may then be chemically removed using the overlying aluminum 15 as a mask. In the preferred embodiment the exposed portions of tungsten-titanium layer 12 are removed by a chemical etchant such as hydrogen peroxide, which may be mixed with ammonium hydroxide to slow the rate of chemical etching. This etchant is applied to the surface of the integrated circuit structure to remove the exposed portions of layer 12 and expose the surface 11 of semiconductor structure 10. For a 1500 Angstrom thick layer of tungsten-titanium alloy comprising 90% tungsten by weight it has been found that hydrogen peroxide will remove the entire thickness of the layer in one minute.

Using well known semiconductor fabrication techniques the photoresist regions 17a, 17b, 17c and 17d, may be removed and/or further manufacturing operations performed, for example, subsequent layers of aluminum or other metal may be deposited. Because the tungsten-titanium layer 12 is relatively thin, the chemical etchant used to remove portions of layer 12 will not undercut the aluminum 15 to any significant extent, thus maintaining accurate dimensional control over the dimensions of the aluminum 15 and regions between those regions. As shown in FIG. 4, the process described above has resulted in connections between aluminum 15a and region 10a of the semiconductor structure, with similar connections being made between region 15b and 10b, region 15c and 10c, and region 15d and 10d.

In some embodiments of the invention the wet chemical etching step used to remove the tungsten-titanium alloy may be intentionally prolonged to excessively undercut the overlying metal layer to achieve sloped edges on the metal layer. This is shown in FIGS. 5–7.

Figure 5:
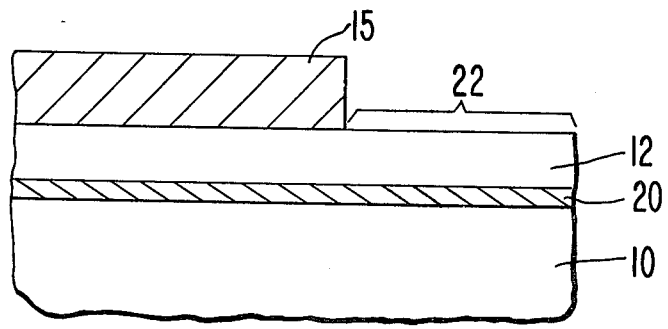

As shown in FIG. 5 a thin layer of titanium 20 is formed across the semiconductor structure 10. Layer 20 typically will be thinner than the subsequently formed alloy layer 12, and in the preferred embodiment is 200 Angstroms thick. Using the processes described above alloy layer 12 and metal layer 15 are formed over layer 20, and layer 15 is etched to create the structure shown in FIG. 5.

Next, in contrast to the process described above, layers 12 and 20 intentionally are etched for a time longer than that required to remove them from region 22 (see FIG. 5). This excessive etching will undercut layer 15 to create the structure shown in FIG. 6. In one embodiment of the invention in which layers 20, 12 and 15 are 200, 1300 and 7500 Angstroms thick, respectively, a 50—50 solution of hydrogen peroxide and ammonium hydroxide has been found to remove the material from region 22 in about one and half minutes. If the wet etch is continued for about an additional half minute a sufficient amount of undercutting of layer 15 has been found to occur.

Figure 6:
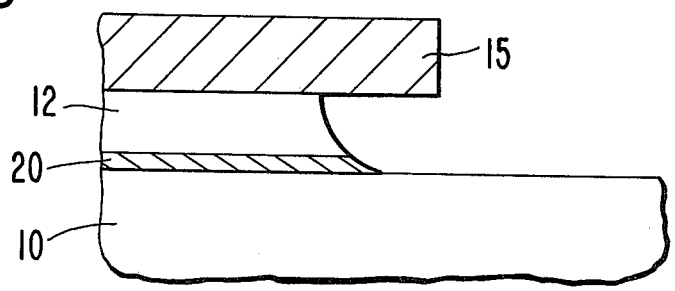
Figure 7:
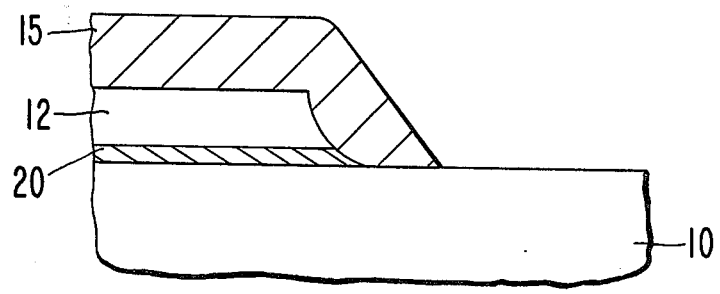

During subsequent processing of the structure shown in FIG. 6 layer 15 usually will be caused to adopt the shape shown in FIG. 7. For example when a dielectric layer (not shown) is formed over layer 15 the heat plus the weight of the overlying material causes the metal overhang to be bent to conform to the shape of the undercut. This has been found to occur, for example, when an 8000 Angstrom thick layer of phosphorous doped vapox is formed using well-known semiconductor processes.

The sloped metal 15 is advantageous in some structures as it provides a more gentle topography for overlying materials to traverse, thereby preventing cracks or other discontinuities in overlying material. In addition, in contrast to previous "sloped edge" processes using etching or ion milling of the metal, the effective cross section of the metal 15 remains substantially constant.

The process of this invention has therefore resulted in the fabrication of metal to silicon contacts without etching of the underlying silicon by the plasma. Further, the tungsten-titanium layer formed will act as a diffusion barrier to aluminum migration into the substrate, and eliminates the need for adding silicon to the aluminum. Consequently, the process of this invention provides more reliable protection from junction spiking, and a smoother more uniform upper surface of the integrated circuit on which to fabricate metal contacts. Further, the tungsten-titanium layer provides a redundant electrical connection over non-uniformities in the underlying wafer structure.

What is claimed is:

1. A process for patterning a layer of conductive material formed on a semiconductor structure comprising;
   depositing a first layer of an alloy of tungsten and titanium on the semiconductor structure;
   depositing the layer of conductive material onto the first layer;
   removing undesired portions of the layer of conductive material by etching said layer with a plasma containing chlorine, wherein the plasma etching is substantially stopped by the first layer after etching through the layer of conductive material;
   removing the thereby exposed portions of the first layer with an etchant other than the plasma etchant used to etch the layer of conductive material;
   removing selected portions of the first layer, said selected portions lying beneath the layer of conductive material and contiguous to the edge of the layer of conductive material; and
   treating at least those portions of the layer of conductive material from beneath which the first layer has been removed to cause those portions to come into contact with the underlying material, the treating including forming a layer of dielectric material over the surface of the layer of selected material.

2. A process as in claim 1, wherein the alloy comprises between 50% and 100% by weight of tungsten.

3. A process as in claim 2, wherein the alloy comprises 90% by weight tungsten.

4. A process as in claim 1, wherein the step of removing the exposed portions of the first layer is performed by a chemical etch which comprises hydrogen peroxide.

5. A process as in claim 4, wherein the chemical etch includes ammonium hydroxide.

6. A process as in claim 1, wherein the first layer is between 500 and 2000 Angstroms thick.

7. A process as in claim 6, wherein the first layer is 1500 Angstroms thick.

8. A process as in claim 1 wherein the step of removing the exposed portions of the first layer is preceded by a step of forming a coating resistant to plasma etching over those portions of the conductive layer which are not to be plasma etched.

9. A process as in claim 8 wherein the coating is photoresist.

10. A process as in claim 1 wherein the conductive material includes aluminum.

11. A process as in claim 10 wherein the conductive material also includes at least one of chromium, silicon, and copper.

12. A process as in claim 1 preceded by the step of forming a layer of titanium on the semiconductor structure.

13. A process as in claim 12 wherein the thickness of the layer of titanium is less than the thickness of the first layer.

14. A process as in claim 13 wherein the layer of titanium is approximately 200 Angstroms thick.

15. A process as in claim 1 wherein the step of removing the exposed portions of the first layer and the step of removing selected portions of the first layer are performed simultaneously.

16. A process as in claim 15 wherein the steps are performed using a chemical etching solution.

17. A process as in claim 16 wherein the solution includes hydrogen peroxide.

18. A process as in claim 1 wherein the step of treating includes heating the layer of selected material.

19. A process as in claim 1 wherein the dielectric material is vapor deposited silicon dioxide.

* * * * *